(12) United States Patent
Taniguchi et al.

(10) Patent No.: US 9,604,317 B2
(45) Date of Patent: Mar. 28, 2017

(54) AU—GA—IN BRAZING MATERIAL

(71) Applicant: Tanaka Kikinzoku Kogyo K.K., Tokyo (JP)

(72) Inventors: Hiroyasu Taniguchi, Kanagawa (JP); Tomohiro Shimada, Kanagawa (JP); Kenichi Miyazaki, Kanagawa (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 230 days.

(21) Appl. No.: 14/460,904

(22) Filed: Aug. 15, 2014

(65) Prior Publication Data

US 2014/0356226 A1 Dec. 4, 2014

Related U.S. Application Data

(62) Division of application No. 12/993,992, filed as application No. PCT/JP2009/062793 on Jul. 15, 2009, now abandoned.

(30) Foreign Application Priority Data

Jul. 24, 2008 (JP) ................................. 2008-191192

(51) Int. Cl.
  *C22C 5/02* (2006.01)
  *B23K 35/30* (2006.01)
  (Continued)

(52) U.S. Cl.
  CPC ...... *B23K 35/3006* (2013.01); *B23K 35/0227* (2013.01); *B23K 35/3013* (2013.01);
  (Continued)

(58) Field of Classification Search
  CPC ...................................................... C22C 5/02
  See application file for complete search history.

(56) References Cited

U.S. PATENT DOCUMENTS 3,141,238 A 7/1964 Harman, Jr.
3,335,489 A 8/1967 Grant
(Continued)

FOREIGN PATENT DOCUMENTS

DE 1234397 B 2/1967
GB 2279662 A 1/1995
(Continued)

OTHER PUBLICATIONS

Jens Bauer, et al., "The influence of the droplet composition on the vapor-liquid-solid growth of InAs nanowires on GaAs (111)B by metal-organic vapor phase epitaxy", Journal of Applied Physics 104, 114315 (2008).

*Primary Examiner* — Jessee Roe
*Assistant Examiner* — Christopher Kessler
(74) *Attorney, Agent, or Firm* — Roberts & Roberts, LLP

(57) ABSTRACT

A brazing material which can be melted at a suitable temperature at which damage is not given to a device inside a package upon sealing, and besides the brazing material is not remelted, e.g., upon mounting to a board, and which has a low temperature difference between a liquidus and a solidus. The brazing material is made of a Au—Ga—In ternary alloy, wherein weight concentrations of the elements lie within a region of a polygon with a point A (Au: 90%, Ga: 10%, In: 0%), a point B (Au: 70%, Ga: 30%, In: 0%), a point C (Au: 60%, Ga: 0%, In: 40%) and a point D (Au: 80%, Ga: 0%, In: 20%) as vertexes (excluding lines on which In and Ga become 0%), in a Au—Ga—In ternary phase diagram.

12 Claims, 3 Drawing Sheets

(51) Int. Cl.
    *B23K 35/02*     (2006.01)
    *H01L 23/10*     (2006.01)

(52) U.S. Cl.
    CPC ............... *C22C 5/02* (2013.01); *H01L 23/10* (2013.01); *H01L 2924/0002* (2013.01); *H01L 2924/01079* (2013.01)

(56) References Cited

U.S. PATENT DOCUMENTS

| | | |
|---|---|---|
| 4,911,762 A | 3/1990 | Steinemann |
| 6,156,266 A | 12/2000 | Cascone |
| 7,074,350 B2 | 7/2006 | Uchida et al. |
| 7,153,375 B2 | 12/2006 | Weinstein |

FOREIGN PATENT DOCUMENTS

| | | |
|---|---|---|
| JP | S62-166096 | 7/1987 |
| JP | S63-165097 | 7/1988 |
| JP | S64-62296 | 3/1989 |
| JP | H03-138096 | 6/1991 |
| JP | H05-70252 | 3/1993 |
| JP | H07-151943 | 6/1995 |
| JP | 2001-150182 | 6/2001 |
| JP | 2007-160340 | 6/2007 |

AU—GA—IN BRAZING MATERIAL

CROSS REFERENCE TO RELATED APPLICATION

This application claims the benefit of U.S. patent application Ser. No. 12/993,992 filed Nov. 22, 2010, now abandoned, which claimed priority from Japanese patent application JP2008-191192 filed on Jul. 24, 2008 and international Application No. PCT/JP2009/062793 filed Jul. 15, 2009 (WO 2010/010833, published Jan. 28, 2010) which are incorporated herein by reference.

BACKGROUND OF THE INVENTION

Field of the Invention

The present invention relates to a brazing material and a sealing method using the brazing material. In particular, the present invention relates to a brazing material used for hermetically sealing a package for various electronic components. The present invention provides a brazing material which is not remelted, e.g., upon mounting to a board without giving damage to a device inside the package upon sealing and has suitable properties.

Description of the Related Art

Electronic components such as an SAW filter and a crystal oscillator used in various types of electronic equipment such as a cellphone are hermetically sealed in a package made of ceramics or the like in view of protecting an internal device. A brazing material for sealing the package has progressively been made lead-free in view of recent environmental protection. In this view, a Au—Sn brazing material (particularly, a Au-20 wt % Sn brazing material having an eutectic composition) is generally used (Patent Document 1). An advantage of the Au—Sn brazing material is that the Au—Sn brazing material enables an efficient sealing operation upon sealing the package since the Au—Sn brazing material has a comparatively low melting point of about 280° C.

Patent Document 1: Japanese Patent Application Laid-Open No. 2001-150182

Although the Au—Sn brazing material has preferable properties upon the sealing operation of the package, the Au—Sn brazing material also has a problem. The problem is caused when the sealed package is mounted to a board. Since a temperature upon mounting is close to the melting point of the Au—Sn brazing material, the heat remelts the brazing material to cause peeling and leak of the sealed part of the package. Another problem to be concerned about, other than the case where the package is mounted to the board, is that when the board is heated to collect damaged parts in repairing the electronic equipment, the heat may break the sealing of other non-damaged parts.

The remelting of the brazing material is caused by the low melting point of the brazing material. Then, brazing materials having some compositions have been proposed in consideration of the problem. For example, Patent Document 2 proposes the application of a Au—Ge brazing material, particularly a Au-12.5% Ge brazing material. The Au—Ge brazing material has a melting point exceeding 360° C. Patent Document 3 proposes a brazing material made of a ternary alloy of Au, Ge and Sn.

Patent Document 2: Japanese Patent Application Laid-Open No. 7-151943

Patent Document 3: Japanese Patent Application Laid-Open No. 2007-160340

Both the Au—Ge brazing material and the Au—Ge—Sn brazing material have a melting point higher than that of the Au—Sn brazing material. The remelting of the brazing materials having a comparatively high melting point after sealing may be reduced.

However, the Au—Ge brazing material tends to have an excessively high melting point. Considering the melting point, a sealing temperature must be set to 400° C. or more. The sealing performed in the high temperature atmosphere increases the thermal damage of a device inside the package, and may possibly damage the element.

On the other hand, it can be said that the Au—Ge—Sn brazing material minimizes the problem of the damage to the composition upon sealing since the Au—Ge—Sn brazing material has a melting point suppressed to a level lower than that of the Au—Ge brazing material. However, ternary alloys such as the Au—Ge—Sn brazing material may cause a problem of a temperature difference between a liquidus and a solidus. How large or small the temperature difference between the liquidus and the solidus affects workability upon sealing the package. In Patent Document 3, the temperature difference is set to be less than 50° C. However, it is preferable if the temperature difference is small.

DISCLOSURE OF THE INVENTION

Problems to be Solved by the Invention

The present invention has been made against the above-described background. The present invention provides a brazing material which can be melted at a suitable temperature at which damage is not given to a device inside a package upon sealing, and besides the brazing material is not remelted, e.g., upon mounting to a board, and which has a small difference in temperature between a liquidus and a solidus. Specifically, the present invention provides a brazing material wherein the liquidus and/or the solidus exceed 280° C. and is 360° C. or less (preferably, both the liquidus and the solidus are within a range of 300 to 340° C.), and a difference between the liquidus and the solidus is less than 45° C. (preferably, less than 40° C.).

SUMMARY OF THE INVENTION

The present inventors have studied the application of a brazing material made of Au, Ga and In as constituent elements and made of a ternary alloy in which Au, Ga and In are alloyed, for solving the above-mentioned problems. The present inventors have found a brazing material having a prescribed composition range, and have hit upon the present invention.

That is, the present invention is a brazing material comprising a Au—Ga—In ternary alloy, wherein weight concentrations of the elements lie within a region of a polygon with a point A (Au: 90%, Ga: 10%, In: 0%), a point B (Au: 70%, Ga: 30%, In: 0%), a point C (Au: 60%, Ga: 0%, In: 40%) and a point D (Au: 80%, Ga: 0%, In: 20%) as vertexes (excluding lines on which In and Ga become 0%), in a Au—Ga—In ternary phase diagram.

The ternary phase diagram showing the composition of the material according to the present invention is shown in FIG. 1. The ternary alloy is applied in the present invention since the melting point of the ternary alloy can be adjusted more effectively than a binary Au alloy (Au—In, Au—Ga) by simultaneously adding two elements of Ga and In to Au. The melting point (the liquidus, the solidus) can be set within a suitable range by setting the added amount of Ga and In to the range within the region. The composition adjustment can also moderately reduce a temperature difference between the liquidus and the solidus. The brazing material of the composition range can be made suitable even in processability and hardness.

In order to make hardness more suitable in addition to the melting point of the brazing material, the temperature difference between the liquidus and the solidus, and processability, it is preferable that the weight concentrations of the elements of the brazing material made of the Au—Ga—In ternary alloy lie within a region of a polygon with a point E (Au: 86%, Ga: 13%, In: 1%), a point F (Au: 81%, Ga: 17%, In: 2%), a point G (Au: 79%, Ga: 10%, In: 11%) and a point H (Au: 84%, Ga: 6%, In: 10%) as vertexes, in the Au—Ga—In ternary phase diagram. It is more preferable that the weight concentrations of the elements of the Au—Ga—In ternary alloy lie within a region of a polygon with a point I (Au: 85%, Ga: 10%, In: 5%), a point J (Au: 80%, Ga: 14%, In: 6%), a point G (Au: 79%, Ga: 10%, In: 11%) and a point H (Au: 84%, Ga: 6%, In: 10%) as vertexes, in the Au—Ga—In ternary phase diagram. Specific examples thereof include a brazing material lying within a range shown in a ternary phase diagram of FIG. 2.

The ternary brazing material according to the present invention may contain at least one addition element of Sn, Ge, Zn, Sb, Si, Bi and Al. These addition elements are added in order to finely adjust the melting point of the brazing material and improve the wettability of the brazing material. The content of the addition element is preferably 0.001 to 3.0% by weight, more preferably 0.01 to 3.0% by weight, and still more preferably 0.1 to 3.0% by weight.

It is preferable that the brazing material according to the present invention has a material structure having a rapidly solidified structure formed from a molten state. It is because the material structure having fine crystal grains formed by rapid solidification improves wettability. The relationship between the rapidly solidified structure and the improvement of the wettability is not obvious. However, in this way, wetting spread tends to be improved upon being melted without changing melting properties such as the liquidus and the solidus. A cooling rate for obtaining the rapidly solidified structure is preferably set to 2000 to 5000° C./min.

The brazing material according to the present invention can be used in any of plate, foil, grain, ball, powder and paste forms. For example, in order to use the brazing material in the ball form, the same method as that of the general brazing material can be used. The brazing material can also be used in a window frame shape, considering the shape of a package member to be sealed. The brazing material according to the present invention can be manufactured by a casting method as in a usual Au alloy without particular difficulty. The brazing material can be processed in the plate and foil forms by rolling and punching or the like if needed. The obtained rolled material can be subjected to press punching and slitting without particular difficulty. Prescribed shapes such as a ring shape and a ribbon shape can be obtained.

Furthermore, the brazing materials of the grain and ball forms can be manufactured from a molten state by an atomization method, a rotating electrode method, a granulation in oil method and a liquid droplet spraying method or the like. As described above, in order to obtain the rapidly solidified structure for improving the wettability of the brazing material, the brazing materials of the plate and foil forms can be manufactured by solidification using a cooling casting mold. The brazing materials of the grain and ball forms can be manufactured according to manufacturing conditions (adjustment of the diameter of a liquid droplet, or the like).

The brazing material according to the present invention is suitable for hermetically sealing the package member. Although the sealing package member has a base accommodating a cap (lid) serving as a lid body and a device, any of the cap and the base is preferably provided with the brazing material made of the alloy according to the present invention. When the brazing material is fixed to the package member, the brazing material is placed on the member, and the brazing material is melted and solidified in a heating atmosphere to be fused. Kovar (an Fe—Ni—Co alloy) and 42 alloy (an Fe—Ni alloy) are generally used as the material of the cap of the package member. Ceramic is used as the material of the base. When the brazing material is fused, a fusing surface is previously subjected to Ni plating and/or Au plating from the object of improving the wettability of the brazing material, or the like. The brazing material according to the present invention can also be fused to the package member previously provided with these plating layers.

In a method for hermetically sealing a package using the brazing material and the package member according to the present invention, the package member is preferably joined with a sealing temperature being 360° C. or more and less than 400° C., and preferably 380° C. or less.

Advantage of the Invention

As described above, the brazing material according to the present invention has suitable melting properties, and is suitable for sealing the package. The brazing material has the improved temperature difference between the liquidus and the solidus, and has excellent workability. The brazing material according to the present invention also has good processability, and can also be processed into a brazing material for a package requiring downsizing and slimming down.

DETAILED DESCRIPTION OF THE PREFERRED EMBODIMENTS

Hereinafter, an embodiment of the present invention and comparative example will be described. In this embodiment, a brazing material made of a Au—Ga—In alloy having various compositions lying within and out of a region of FIG. 1, and a brazing material in which Sn was added to a Au—Ga—In alloy were manufactured. The properties of the brazing materials were considered. In manufacture of samples, metals weighed so as to have a prescribed composition were melted, cast, and subjected to rolling to produce brazing materials having a thickness of 50 μm.

The manufactured brazing materials were first evaluated for hardness, processability and melting properties (liquidus, solidus). The brazing materials were evaluated for the hardness with a Vickers hardness meter. The processed brazing materials were evaluated for the processability by observing the existence or nonexistence of occurrence of break and crack of the brazing materials with a stereoscopic microscope (10 times). The brazing materials having no break and crack and capable of being processed were evaluated as good. The brazing materials having observed break or crack were evaluated as poor. The melting properties were measured by differential thermal analysis. These results are shown in Table 1. This evaluation was also performed for Au—Ga (15.2%) which did not contain In for contrast (sample No. 12).

TABLE 1

| | Composition (wt %) | | | | Hardness | | Melting properties | | |
|---|---|---|---|---|---|---|---|---|---|
| No. | Au | Ga | In | Sn | (Hv) | Processability | Solidus (° C.) | Liquidus (° C.) | Difference between liquidus and solidus (° C.) |
| 1 | 84 | 13 | 3 | — | 242 | good | 304 | 317 | 13 |
| 2 | 82 | 10 | 8 | — | 267 | good | 306 | 322 | 16 |
| 3 | 83 | 10 | 7 | — | 290 | good | 306 | 321 | 15 |
| 4 | 81 | 10 | 9 | — | 292 | good | 306 | 323 | 17 |
| 5 | 82 | 11 | 7 | — | 300 | good | 306 | 324 | 18 |
| 6 | 83 | 9 | 8 | — | 301 | good | 306 | 323 | 17 |
| 7 | 81.95 | 10.00 | 8.00 | 0.05 | 292 | good | 306 | 320 | 14 |
| 8 | 81.19 | 9.90 | 7.92 | 0.99 | 300 | good | 282 | 302 | 20 |
| 9 | 67 | 25 | 8 | — | 180 | good | 390 | 462 | 72 |
| 10 | 65 | 18 | 17 | — | 224 | good | 380 | 418 | 38 |
| 11 | 62 | 13 | 25 | — | 257 | good | 383 | 408 | 25 |
| 12 | 84.8 | 15.2 | 0 | — | 210 | good | 339 | 358 | 19 |

Figure 1:
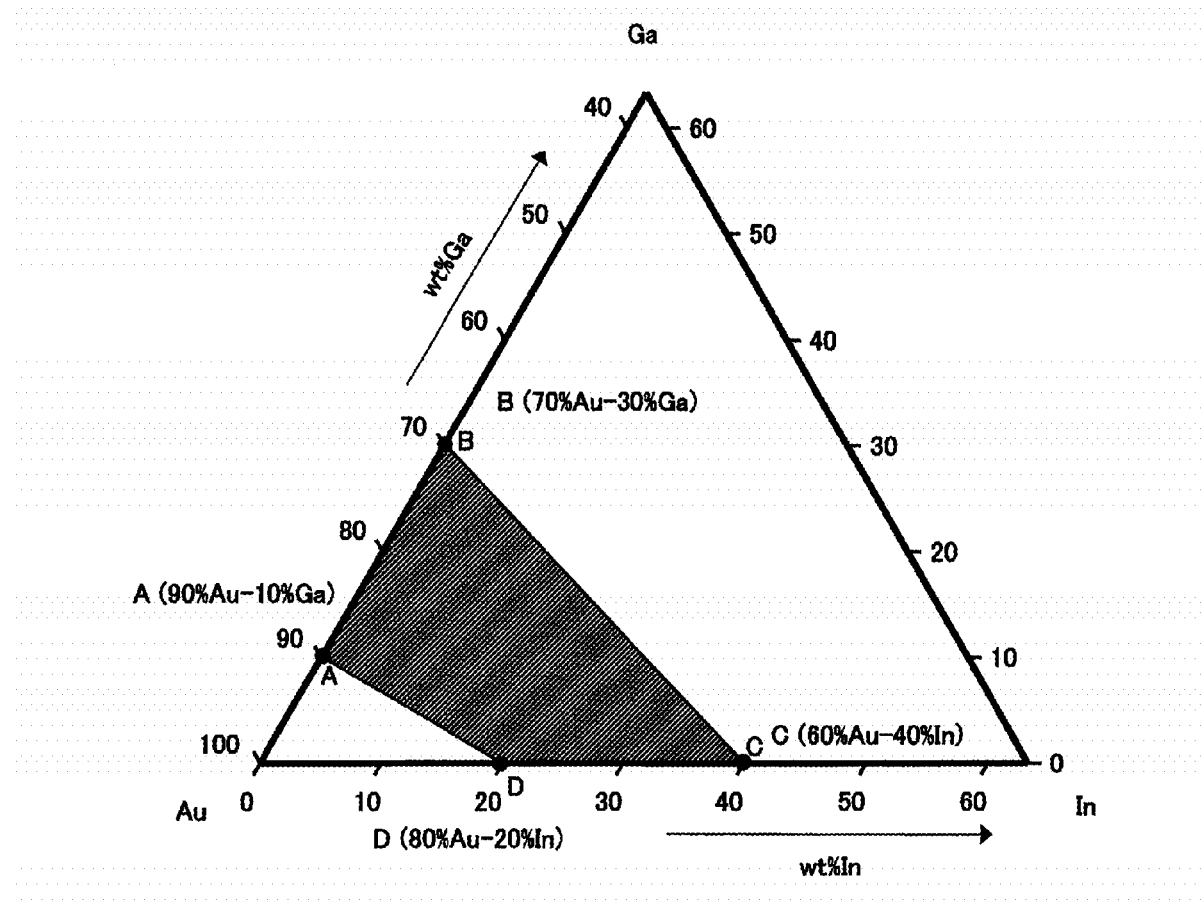
FIG. 1 is a Au—Ga—In ternary phase diagram showing a composition of a material according to the present invention.
Figure 2:
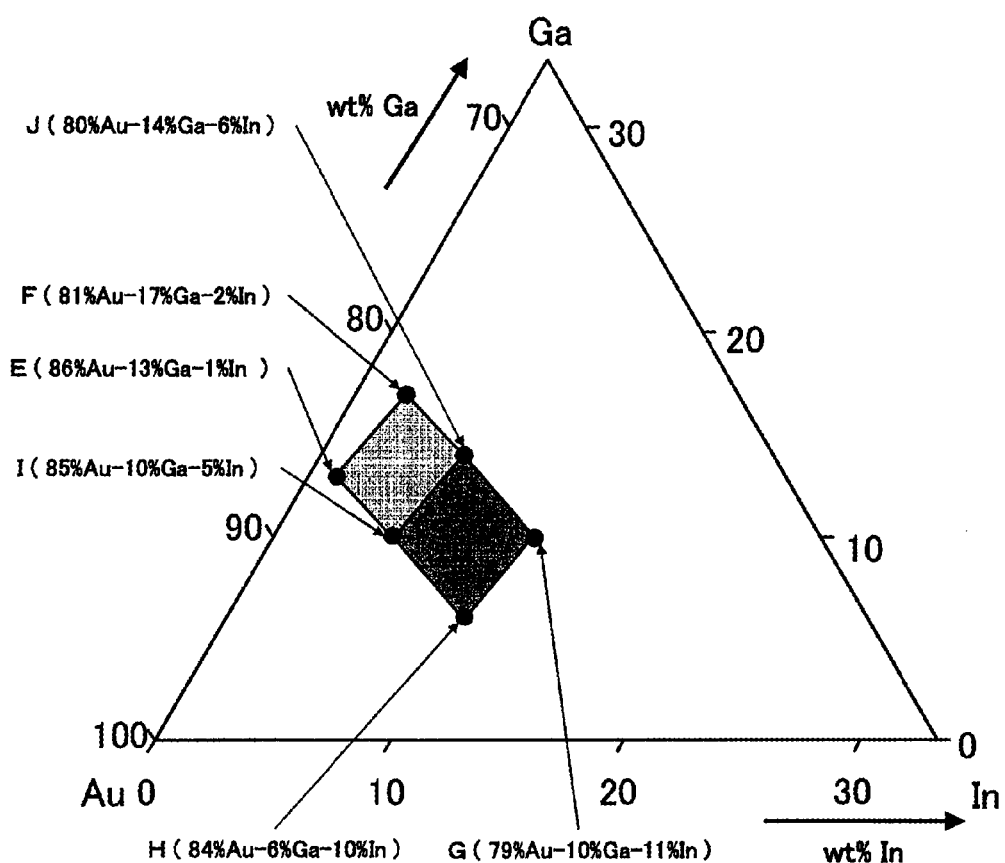
FIG. 2 is a Au—Ga—In ternary phase diagram showing a preferable composition and a more preferable composition of a material according to the present invention.

Table 1 shows that both the solidus and the liquidus of Au—Ga—In brazing materials (samples 1 to 6) having compositions lying within a region of FIG. 1 are within a range of 300 to 340° C., and furthermore exhibit extremely excellent melting properties since the difference between the solidus and the liquidus is less than 20° C. These brazing materials are predicted to have a small difference with a sealing temperature upon sealing a package. It is thought that the brazing materials are most suitable as a brazing material for sealing the package. Particularly, the brazing materials of the samples 2 to 6 provide a result of having also sufficient hardness in addition to excellent melting properties. On the other hand, Table 1 shows that samples 9 to 11 having compositions lying out of the region of FIG. 1 have a high solidus and liquidus, and the difference between the solidus and the liquidus is also large. Since the Au—Ga brazing material (sample 12) which does not contain In has a composition close to an eutectic composition, the Au—Ga brazing material has a narrow difference between the solidus and the liquidus. However, since the Au—Ga brazing material has a high melting point, it cannot be said that the Au—Ga brazing material is suitable.

On the other hand, there was observed an effect of notably reducing a melting point without extending the difference between the liquidus and the solidus of the melting point by adding Sn from a result of evaluating brazing materials (samples 7 and 8) to which Sn was added as an addition element. This reduction effect of the melting point was observed not only when Sn was added but also when at least one addition element of Ge, Zn, Sb, Si, Bi and Al was added.

Figure 3:
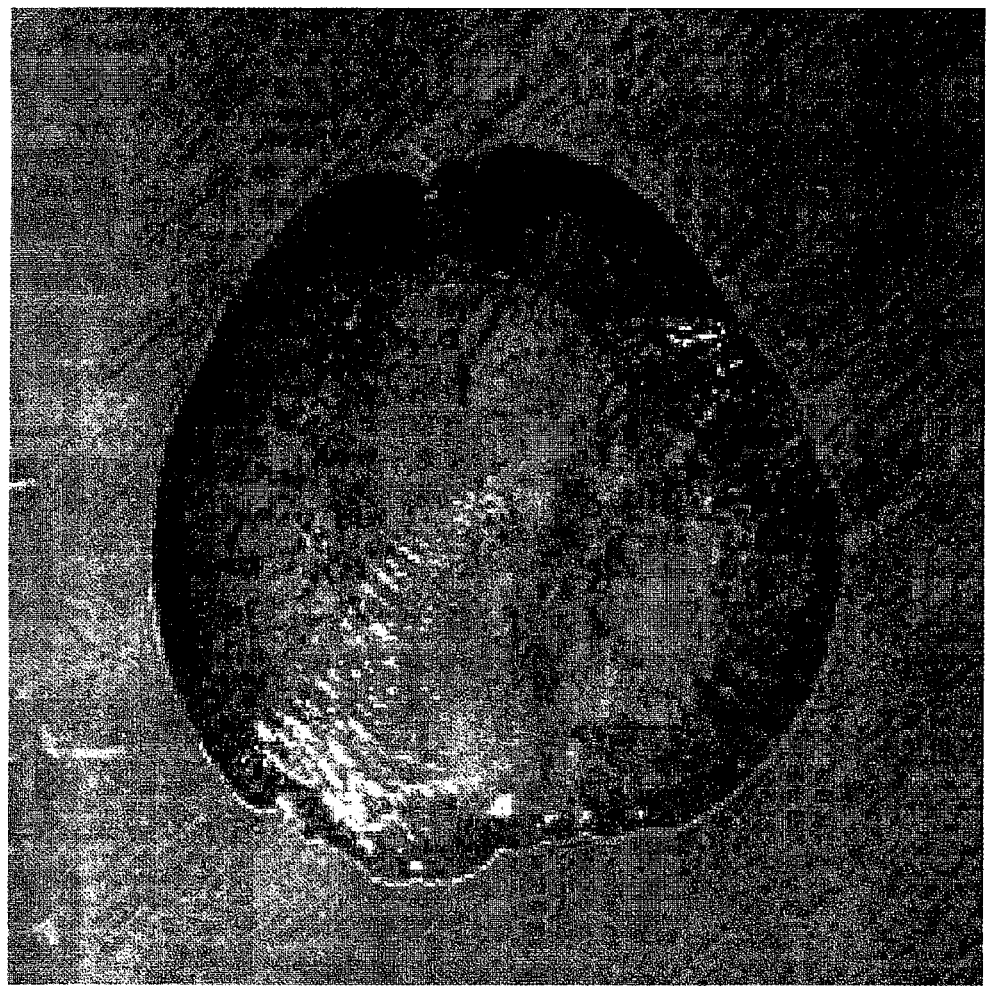
FIG. 3 is an evaluation diagram of wettability of a Au—Ga—In ternary brazing material (Au: 82%, Ga: 10%, In: 8%).

FIG. 3 shows a result of evaluating wettability of the ternary brazing material (Au=82%, Ga: 10%, In: 8%) of the sample 2. The wettability was evaluated by putting a brazing material on Kov/Ni plating/Au plating, heating the brazing material to a temperature 20° C. higher than a melting point under an inactive atmosphere, and holding the brazing material for 2 minutes to be melted. When the brazing material portion was wholly and homogeneously wet-spread, the brazing material was determined as good. When the brazing material portion was not wet-spread, the brazing material was determined as poor. The result shows that the brazing material portion is wholly and homogeneously wet-spread, and the brazing material exhibits good wettability.

INDUSTRIAL APPLICABILITY

There can be provided a brazing material which can be melted at a suitable temperature at which damage is not given to a device inside a package upon sealing, and besides the brazing material is not remelted, e.g., upon mounting to a board, and which has a small temperature difference between a liquidus and a solidus.

What is claimed is:

1. A sealing method comprising brazing components with a brazing material, which brazing material comprises a Au—Ga—In ternary alloy, wherein weight concentrations of the elements lie within a region of a polygon with a point A (Au: 90%, Ga: 10%, In: 0%), a point B (Au: 70%, Ga: 30%, In: 0%), a point C (Au: 60%, Ga: 0%, In: 40%) and a point D (Au: 80%, Ga: 0%, In: 20%) as vertexes, excluding lines on which In and Ga become 0%, in a Au—Ga—In ternary phase diagram.

2. The sealing method according to claim 1, wherein the weight concentrations of the elements of the Au—Ga—In ternary alloy of the brazing material lie within a region of a polygon with a point I (Au: 85%, Ga: 10%, In: 5%), a point J (Au: 80%, Ga: 14%, In: 6%), a point G (Au: 79%, Ga: 10%, In: 11%) and a point H (Au: 84%, Ga: 6%, In: 10%) as vertexes, in the Au—Ga—In ternary phase diagram.

3. The sealing method according to claim 1, wherein the weight concentrations of the elements of the Au—Ga—In ternary alloy of the brazing material lie within a region of a polygon with a point E (Au: 86%, Ga: 13%, In: 1%), a point F (Au: 81%, Ga: 17%, In: 2%), a point G (Au: 79%, Ga: 10%, In: 11%) and a point H (Au: 84%, Ga: 6%, In: 10%) as vertexes, in the Au—Ga—In ternary phase diagram.

4. The sealing method according to claim 1, wherein the weight concentrations of the elements of the Au—Ga—In ternary alloy of the brazing material lie within a region of a polygon with a point I (Au: 85%, Ga: 10%, In: 5%), a point J (Au: 80%, Ga: 140%, In: 6%), a point G (Au: 79%, Ga: 10%, In: 11%) and a point H (Au: 84%, Ga: 6%, In: 10%) as vertexes, in the Au—Ga—In ternary phase diagram.

5. The sealing method according to claim 1 wherein the brazing material has a material structure having a rapidly solidified structure formed from a molten state.

6. The sealing method according to claim 2 wherein the brazing material has a material structure having a rapidly solidified structure formed from a molten state.

7. The sealing method according to claim 3 wherein the brazing material has a material structure having a rapidly solidified structure formed from a molten state.

8. The sealing method according to claim 4 wherein the brazing material has a material structure having a rapidly solidified structure formed from a molten state.

9. The sealing method according to claim 1 which comprises the step of fusing the brazing material to a package member.

10. The sealing method according to claim 9 wherein the brazing material is placed on the package member, the brazing material is melted in a heating atmosphere, and the brazing material is solidified such that it is fused to the package member.

11. The sealing method according to claim 10 wherein the brazing material is heated to a temperature ranging from 360° C. to 400° C.

12. The sealing method according to claim 1 wherein the brazing material is heated and solidified to hermetically seal a package.

\* \* \* \* \*